US006593057B2

(12) United States Patent
Kita

(10) Patent No.: US 6,593,057 B2
(45) Date of Patent: Jul. 15, 2003

(54) HEAT-SENSITIVE LITHOGRAPHIC PRINTING PLATE PRECURSOR

(75) Inventor: Nobuyuki Kita, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 151 days.

(21) Appl. No.: 09/799,116

(22) Filed: Mar. 6, 2001

(65) Prior Publication Data

US 2001/0033992 A1 Oct. 25, 2001

(30) Foreign Application Priority Data

Mar. 21, 2000 (JP) ....................................... 2000-078439

(51) Int. Cl.[7] ................................................ G03F 7/038

(52) U.S. Cl. ................................ 430/270.1; 430/271.1; 430/272.1; 430/273.1; 430/280.1; 101/453; 101/454; 101/455; 101/456; 101/457

(58) Field of Search ........................... 430/270.1, 271.1, 430/272.1, 273.1, 280.1, 281.1, 302, 348, 944, 945, 964; 101/453, 454, 455, 456, 457, 463.1, 465

(56) References Cited

U.S. PATENT DOCUMENTS

| | | | | | |
|---|---|---|---|---|---|
| 5,962,188 A | * | 10/1999 | DeBoer et al. | .......... | 430/273.1 |
| 6,087,069 A | * | 7/2000 | Ellis | ........................ | 430/273.1 |
| 6,090,524 A | * | 7/2000 | Deboer et al. | ........... | 430/272.1 |
| 6,110,645 A | * | 8/2000 | DeBoer et al. | ............. | 430/302 |
| 6,136,508 A | * | 10/2000 | DeBoer et al. | ............. | 430/302 |
| 6,152,036 A | * | 11/2000 | Verschueren et al. | ....... | 101/457 |
| 6,312,866 B1 | * | 11/2001 | Obuchowicz et al. | .... | 430/270.1 |
| 6,397,749 B1 | * | 6/2002 | Kita et al. | .................. | 101/457 |
| 6,399,276 B1 | * | 6/2002 | Van Damme et al. | ... | 430/273.1 |
| 6,455,222 B1 | * | 9/2002 | Fukino et al. | ........... | 430/270.1 |
| 2001/0008740 A1 | * | 7/2001 | Kita | ........................ | 430/270.1 |
| 2001/0024766 A1 | * | 9/2001 | Kita et al. | ............... | 430/272.1 |

FOREIGN PATENT DOCUMENTS

| | | | | |
|---|---|---|---|---|
| EP | 0960728 A1 | | 12/1999 | |
| EP | 1072402 A2 | | 1/2001 | |
| JP | 1-126362 | * | 5/1989 | ........... C08L/63/00 |
| WO | WO 99/19143 | | 4/1999 | |
| WO | WO 99/19144 | | 4/1999 | |

OTHER PUBLICATIONS

Knovel: Engineering & Scientific Online References. Accessed Oct. 1, 2002 <http://www.knovel.com/knovel2/default.jsp>.*

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A heat-sensitive lithographic printing plate precursor is disclosed, comprising a metal substrate having thereon 1) an ink-receptive layer, 2) a water-receptive layer comprising a colloidal particulate oxide or hydroxide of at least one element selected from the group consisting of beryllium, magnesium, aluminum, silicon, titanium, boron, germanium, tin, zirconium, iron, vanadium, antimony and transition metals, or additionally 3) a water-soluble overcoat layer, at least one layer of the ink-receptive layer, the water-receptive layer and the overcoat layer containing a compound capable of converting light into heat and the ink-receptive layer containing an epoxy resin having a softening point of 120° C. or more.

7 Claims, No Drawings

HEAT-SENSITIVE LITHOGRAPHIC PRINTING PLATE PRECURSOR

FIELD OF THE INVENTION

The present invention relates to a heat-sensitive lithographic printing plate precursor which can dispense with development. More specifically, the present invention relates to a lithographic printing plate precursor which can record an image by the exposure of scanning an infrared ray laser beam based on digital signals, which can be mounted on a printing press as it is after the image recording and used for printing without passing through a development process as in conventional techniques, and which is improved in the impression capacity.

BACKGROUND OF THE INVENTION

Various methods have been proposed for the lithographic printing plate precursor which can be mounted on a printing press as it is after the exposure without passing through any processing and used for printing. One promising method is a method of exposing an printing plate precursor with a solid high output infrared ray laser such as semiconductor laser and YAG laser, generating heat on the exposed area by a compound capable of converting light into heat which converts light into heat, and causing decomposition and evaporation using ablation.

That is, this is a method of providing a water-receptive layer on a substrate having a lipophilic ink-receptive surface or a lipophilic ink-receptive layer, and removing the water-receptive layer by ablation.

WO98/40212 and WO99/19143 disclose a lithographic printing plate precursor capable of being mounted on a printing press without passing through development, where an ink-receptive layer and a water-receptive layer mainly comprising a colloid such as silica crosslinked by a crosslinking agent such as aminopropyltriethoxysilane are provided on a substrate. This ink-receptive layer may contain, as a binder polymer, polycarbonate, polyester, polyvinyl butyral, polyacrylate or a chemically modified cellulose derivative in addition to a compound capable of converting light into heat, and the water-receptive layer is improved in the impression capacity by crosslinking the colloid using a crosslinking agent.

WO99/19144 discloses a lithographic printing plate precursor where a heat-insulating layer containing no compound capable of converting light into heat is provided, in place of the above-described ink-receptive layer and it is stated that cellulose acetate, polymethyl methacrylate, polystyrene, polyvinyl butyral or a polycarbonate is used for the heat-insulating layer.

However, according to these techniques, the impression capacity is as low as thousands of sheets.

SUMMARY OF THE INVENTION

Accordingly, the object of the present invention is to solve the above-described problems and provide a heat-sensitive lithographic printing plate precursor comprising a metal support, which can be mounted directly on a printing press after the exposure without passing through any processing and used for printing and which is improved in the impression capacity.

As a result of extensive investigations to solve those problems, the present inventors have found that the above-described objects can be attained by incorporating an epoxy resin having a softening point of 120° C. or more into the ink-receptive layer.

That is, the present invention is as follows.

1. A heat-sensitive lithographic printing plate precursor comprising a metal substrate having thereon 1) an ink-receptive layer and 2) a water-receptive layer comprising a colloidal particulate oxide or hydroxide of at least one element selected from the group consisting of beryllium, magnesium, aluminum, silicon, titanium, boron, germanium, tin, zirconium, iron, vanadium, antimony and transition metals, at least one layer of the ink-receptive layer and the water-receptive layer containing a compound capable of converting light into heat and the ink-receptive layer containing an epoxy resin having a softening point of 120° C. or more (by Durance s mercury method).

2. The heat-sensitive lithographic printing plate precursor comprising a metal substrate having thereon 1) an ink-receptive layer and 2) the water-receptive layer as described in the above item 1, wherein 3) a water-soluble overcoat layer is further provided over the metal substrate; at least one layer of the ink-receptive layer, the water-receptive layer and the water-soluble overcoat layer contains a compound capable of converting light into heat and the ink-receptive layer contains an epoxy resin having a softening point of 120° C. or more.

DETAILED DESCRIPTION OF THE INVENTION

The ink-receptive layer of the present invention contains an epoxy resin having a softening point of 120° C. or more. Suitable examples of the epoxy resin include polyaddition products having a softening point of 120° C. or more, preferably 140° C. or more, such as bisphenol A/epichlorohydrin polyaddition product, bisphenol F/epichlorohydrin polyaddition product, halogenated bisphenol A/epichlorohydrin polyaddition product, biphenyl-type bisphenol/epichiorohydrin polyaddition product and novolak resin/epichiorohydrin polyaddition product. Specific examples thereof include EPIKOTE 1007 (softening point: 128° C., Mn: about 2,900, epoxy equivalent: 2,000), EPIKOTE 1009 (softening point: 144° C., Mn: about 3,750, epoxy equivalent: 3,000), EPIKOTE 1010 (softening point: 169° C., Mn: about 5,500, epoxy equivalent: 4,000), EPIKOTE 1100L (softening point: 149° C., epoxy equivalent: 4,000) and EPIKOTE YX31575 (softening point: 130° C., epoxy equivalent: 1,200), all produced by Yuka Shell Epoxy Co., Ltd.

The epoxy resin is dissolved in an appropriate solvent, coated on a substrate and dried to provide an ink-receptive layer on the substrate. Only the epoxy resin may be used by dissolving it in a solvent, however, if desired, a coloring agent, an inorganic or organic fine particle, a coating surface (state) improver, a plasticizer and an adhesive aid may be added.

In addition, a thermal coloration- or decolorization-type additive may also be added for forming a print-out image after the exposure.

The coloring agent is an ordinary dye or pigment and examples thereof include Rhodamine 6G chloride, Rhodamine B chloride, Crystal Violet, Malachite Green Oxalate, Oxazine 4 Perchlorate, quinizarin, 2-(α-naphthyl)-5-phenyloxazole and coumarin-4. Specific examples of other dyes include triphenyl methane-, diphenyl methane-, oxazine-, xanthene-, iminonaphthoquinone-, azomethine- or anthraquinone-based dyes represented by Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Kagaku Kogyo K.K.), Victoria Pure Blue, Crystal Violet (CI42555), Methyl Violet (CI42535), Ethyl Violet, Methylene Blue (CI52015), Patent Pure Blue (all produced by Sumitomo Mikuni Kagaku), Brilliant Blue, Methyl Green, Erythrisine B, Basic Fuchsine, m-Cresol Purple, Auramine, 4-p-diethylaminophenyliminonaphthoquinone and cyano-p-diethylaminophenylacetanilide, and dyes described in JP-A-62-293247 (the term "JP-A" used herein means an "unexamined published Japanese patent application") and JP-A-9-179290.

The dye is usually added, when added into the ink-receptive layer, in a ratio of about 0.02 to 10% by weight, preferably from about 0.1 to 5% by weight, based on the entire solid content of the receptive layer.

In addition, a fluorine-containing surfactant or a silicon-containing surfactant, which are a compound well-known as a coating surface (state) improver, may also be used. More specifically, a surfactant having a perfluoroalkyl group or a dimethylsiloxane group is useful for conditioning the coating surface state.

Examples of the inorganic or organic fine powder which can be used in the present invention include colloidal silica and colloidal aluminum, having a particle size of 10 to 100 nm; inactive particles having a particle size larger than those colloids, such as silica particle, surface hydrophobitized silica particle, alumina particle and titanium dioxide particle; other heavy metal particles; clay; and talc. By adding this inorganic or organic fine powder into the ink-receptive layer, an effect of improving the adhesive property to the upper water-receptive layer and improving the impression capacity in printing is provided. In the ink-receptive layer, the ratio of the fine powder added is preferably 80% by weight or less, more preferably 40% by weight or less, based on the solid content of the ink-receptive layer.

If desired, a plasticizer is added to the ink-receptive layer of the present invention so as to impart flexibility to the film. Examples of the plasticizer which can be used include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

Examples of the coloration- or decolorization-type additive which can be added to the ink-receptive layer of the present invention include combinations of a heat acid generator such as diazo compound or diphenyl iodonium salt, and a leuco dye (lactone form of Leuco Malachite Green, Leuco Crystal Violet or Crystal Violet) or a pH discoloring dye (for example, dyes such as Ethyl Violet and Victoria Pure Blue BOH). In addition, combinations of an acid coloring dye with an acidic binder described in EP897134 are also effective. In this case, the bond in the association state of forming the dye is broken by heating to yield a lactone form and thereby cause the change from chromatic to achromatic.

These additives are each preferably added in a ratio of 10% by weight or less, more preferably 5% by weight or less, based on the solid content of the ink-receptive layer.

Examples of the solvent which can be used in coating the ink-receptive layer include alcohols (e.g. , methanol, ethanol, propyl alcohol, ethylene glycol, diethylene glycol, propylene glycol, dipropylene glycol, ethylene glycol monomethyl ether, propylene glycol monomethyl ether, ethylene glycol monoethyl ether), ethers (e.g., tetrahydrofuran, ethylene glycol dimethyl ether, propylene glycol dimethyl ether, tetrahydropyrane), ketones (e.g., acetone, methyl ethyl ketone, acetyl acetone), esters (e.g., methyl acetate, ethylene glycol monomethyl monoacetate) amides (e.g., formamide, N-methylformamide, pyrrolidone, N-methylpyrrolidone), γ-butyrolactone, methyl lactate and ethyl lactate. These solvents are used individually or in combination. The concentration of the above-described ink-receptive layer components (the entire solid content including additives) in the coating solution is preferably from 1 to 50% by weight.

The thickness of the ink-receptive layer of the present invention after coating and drying is not particularly limited but may be 0.1 μm or more. In the case of the present invention where the ink-receptive layer is provided on a metal plate, the ink-receptive layer has a function as a heat-insulating layer and therefore, the thickness thereof is preferably 0.5 μm or more. If the ink-receptive layer is too thin, the heat generated disadvantageously diffuses toward the metal plate and the sensitivity decreases. Moreover, in the case of a hydrophilic metal plate, the ink-receptive layer is required to have abrasion resistance and therefore, the impression capacity cannot be ensured.

The substrate on which the ink-receptive layer of the present invention is coated is a metal substrate having good dimensional stability. Preferred examples of the metal substrate include aluminum, zinc, copper, nickel and stainless steel. Among these, aluminum substrate is more preferred.

The starting material aluminum plate used for the aluminum substrate of the present invention may be appropriately selected from conventionally known and commonly used aluminum plate materials. More specifically, the starting material aluminum plate is a pure aluminum plate or an alloy plate mainly comprising aluminum and containing trace foreign elements. Examples of the foreign elements contained in the aluminum alloy include silicon, iron, manganese, copper, magnesium, chromium, zinc, bismuth, nickel and titanium. The content of foreign elements in the alloy is 10% by weight or less. The aluminum plate may also be an aluminum plate obtained from an aluminum ingot using DC casting or continuous casting.

The thickness of the aluminum substrate for use in the present invention is from 0.05 to 0.6 mm, preferably from 0.1 to 0.4 mm, more preferably from 0.15 to 0.3 mm.

Before coating the ink-receptive layer on an aluminum plate, the surface of the aluminum plate is preferably roughened. By the surface roughening, the surface area can be increased and the adhesion to the upper layer can be improved.

The surface roughening treatment of the aluminum plate is performed by various methods, for example, by a method of mechanically roughening the surface, a method of electrochemically dissolving and roughening the surface, a method of chemically dissolving the selected surface, or a combination of two or more of these methods. In the mechanical method, a known method such as ball polishing, brush polishing, blast polishing or buff polishing may be used. The chemical method is preferably a method of dipping the aluminum plate in a saturated aqueous solution containing an aluminum salt of mineral acid described in JP-A-54-31187. The electrochemical surface roughening method includes a method of performing the treatment by passing an alternating current or direct current through an electrolytic solution containing an acid such as hydrochloric acid or nitric acid. An electrolytic surface roughening method using a mixed acid as disclosed in JP-A-54-63902 may also be used.

The surface roughening by the above-described method is preferably performed such that the center line average surface roughness (Ra) [defined in JIS B0601] on the surface of aluminum plate is from 0.3 to 1.0 μm.

After the surface roughening, the aluminum plate may be, if desired, subjected to an alkali etching treatment with an aqueous solution of potassium hydroxide or sodium hydroxide, to a neutralization treatment and then to an anodization treatment.

The electrolyte which can be used in the anodization treatment of the aluminum plate includes various electrolytes capable of forming a porous oxide film and in general, sulfuric acid, phosphoric acid, oxalic acid, chromic acid, sulfamic acid, benzenesulfonic acid or a mixed acid thereof is used. The concentration of the electrolyte is appropriately determined depending on the kind of electrolyte.

The anodization treatment conditions vary depending on the electrolyte used and therefore, cannot be indiscriminately specified, however, suitable conditions are such that the concentration of electrolyte is from 1 to 80% by weight based on the solution, the liquid temperature is from 5 to 70° C., the current density is from 5 to 60 $A/dm^2$, the voltage is from 1 to 100 V, and the electrolysis time is from 10 seconds to 50 minutes.

Among these anodization treatments, preferred are a method of performing the anodization at a high current density in sulfuric acid described in British Patent 1,412,768 and a method of performing the anodization treatment using phosphoric acid as the electrolytic bath described in U.S. Pat. No. 3,511,661.

In the present invention, the oxide film of the aluminum substrate preferably has a weight of 2.0 $g/m^2$ or more, more preferably from 2.0 to 6.0 $g/m^2$, still more preferably from 2.0 to 4.0 $g/m^2$.

The aluminum substrate of the present invention may be subjected to a sealing treatment of the anodic oxide film. The sealing treatment may be performed by a well-known method such as hot water sealing, boiling water sealing, steam sealing, bichromate sealing, nitrite sealing, ammonium acetate sealing or electrodeposition sealing.

Other than these, a sealing treatment using fluorozirconate described in JP-B-36-22063 (the term "JP-B" as used herein means an "examined Japanese patent publication"), an aqueous solution containing a phosphate and an inorganic fluorocompound described in JP-A-9-244227, or an aqueous solution containing a sugar described in JP-A-9-134002 may be used.

Furthermore, a sealing treatment using an aqueous solution containing titanium and fluorine described in JP-A-81704/2000 and JP-A-89466/2000 may be used.

In addition, the sealing treatment may be performed using an alkali metal silicate and in this case, a method described in U.S. Pat. No. 3,181,461 and the like may be used.

After the anodization and if desired, after the sealing treatment, the aluminum substrate for use in the present invention may be subjected to a surface treatment, for example, a dipping treatment in an aqueous solution of alkali silicate such as sodium silicate, a dipping treatment in a polymer or copolymer having polyvinyl phosphonic acid, polyacrylic acid or sulfonic acid on the side chain or in a solution containing an organic compound or a salt thereof having (a) an amino group and (b) a group selected from phosphine group, phosphone group and phosphoric acid group described in JP-A-11-231509, or a undercoating treatment with this solution.

The water-receptive layer for use in the present invention comprises a colloidal particulate oxide or hydroxide of at least one element selected from beryllium, magnesium, aluminum, silicon, titanium, boron, germanium, tin, zirconium, iron, vanadium, antimony and transition metals.

The colloidal particulate oxide or hydroxide of these elements is produced as a dispersed phase of a colloidal dispersion solution, namely, colloidal particles, by various known methods such as hydrolysis of a halide or alkoxy compound of the above-described element, or condensation of a hydroxide of the element. In the case of adding this to the coating solution for the water-receptive layer, the colloidal particulate oxide or hydroxide of the element can be added in the form of a colloidal dispersion solution.

Among oxides or hydroxides of those elements, preferred is an oxide or a hydroxide of at least one element selected from aluminum, silicon, titanium and zirconium.

The colloidal particle of the oxide or hydroxide of the element is preferably a spherical particle having a colloidal particle size of 5 to 100 nm in the case of silica. A pearl necklace-like colloidal particle where spherical particles of 10 to 50 nm lie in a row to a length of 50 to 400 nm may also be used. Furthermore, a plumous particle of 100 nm×100 nm, such as colloidal particle of oxide or hydroxide of aluminum, is also effective.

These colloidal dispersion solutions can also be a product available on the market, for example, from Nissan Chemical Co., Ltd.

As the dispersion medium for these colloidal particles, water and an organic solvent such as methanol, ethanol, ethylene glycol monomethyl ether and methyl ethyl ketone are useful.

In the water-receptive layer of the present invention, a hydrophilic resin or a resin having an aromatic hydroxyl group may be used together with the above-described colloidal particle. By using this resin, the water-receptive layer can be enhanced in the film strength, the impression capacity can be enhanced or the inking property can be improved.

The hydrophilic resin preferably has a hydrophilic group such as hydroxyl group, carboxyl group, hydroxyethyl group, hydroxypropyl group, amino group, aminoethyl group, aminopropyl group or carboxymethyl group.

Specific examples of the hydrophilic resin include gum arabic, casein, gelatin, a starch derivative, carboxymethyl cellulose and a sodium salt thereof, cellulose acetate, sodium alginate, a vinyl acetate-maleic acid copolymer, a styrene-maleic acid copolymer, polyacrylic acid and a salt thereof, polymethacrylic acid and a salt thereof, a homopolymer and a copolymer of hydroxyethyl methacrylate, a homopolymer and a copolymer of hydroxyethyl acrylate, a homopolymer and a copolymer of hydroxypropyl methacrylate, a homopolymer and a copolymer of hydroxypropyl acrylate, a homopolymer and a copolymer of hydroxybutyl methacrylate, a homopolymer and a copolymer of hydroxybutyl acrylate, polyethylene glycol, polypropylene oxide, polyvinyl alcohol, hydrolyzed polyvinyl acetate having a hydrolysis degree of at least 60% by weight, preferably at least 80% by weight, polyvinyl formal, polyvinyl butyral, polyvinyl pyrrolidone, a homopolymer and a copolymer of acrylamide, a homopolymer and a copolymer of methacrylamide, and a homopolymer and a copolymer of N-methylolacrylamide.

The hydrophilic resin is particularly preferably a water-insoluble hydroxyl group-containing polymer and specific examples thereof include a homopolymer and a copolymer of hydroxyethyl methacrylate and a homopolymer and a copolymer of hydroxyethyl acrylate.

The ratio of the hydrophilic resin added is preferably 40% by weight or less based on the solid content of the water-receptive layer in the case where the hydrophilic resin is water-soluble, and preferably 20% by weight or less based on the solid content of the water-receptive layer in the case where the hydrophilic resin is water-insoluble.

The resin having an aromatic hydroxyl group for use in the water-receptive layer of the present invention is preferably a resin which dissolves in methanol in a ratio of 5% by weight or more at 25° C., and examples thereof include alkali-soluble resins such as novolak resin, resol resin, polyvinyl phenol resin and ketone pyrogallol resin.

Preferred examples of the novolak resin include novolak resins obtained by performing an addition condensation of at least one hydroxyl group-containing aromatic compound selected from phenol, o-cresol, m-cresol, p-cresol, 2,5-xylenol, 3,5-xylenol and resorcinol to at least one aldehyde selected from formaldehyde, acetaldehyde and propionaldehyde, in the presence of an acidic catalyst. The formaldehyde and acetaldehyde may be replaced by paraformaldehyde and para-aldehyde, respectively.

Among these, preferred are novolak resins which are an addition condensate of an aldehyde with a mixture of m-cresol:p-cresol:2,5-xylenol:3,5-xylenol:resorcinol in a mixing ratio by mol of 40–100:0–50:0–20:0–20:0–20 or a mixture of phenol:m-cresol:p-cresol in a mixing ratio by mol of 1–100:0–70:0–60. Among those aldehydes, formaldehyde is preferred.

The novolak resin preferably has a weight average molecular weight in terms of polystyrene (hereinafter simply referred to as a "weight average molecular weight") by gel permeation chromatography (hereinafter simply referred to as "GPC"), of 1,000 to 15,000, more preferably from 1,500 to 10,000.

Preferred examples of the resol resin include resol resins obtained by performing an addition condensation of at least one hydrocarbon selected from hydroxyl group-containing aromatic hydrocarbons such as phenol, m-cresol, o-cresol, p-cresol, 2,5-xylenol, 3,5-xylenol, resorcinol, pyrogallol, bis-(4-hydroxyphenyl)methane, bisphenol A, o-ethylphenol, m-ethylphenol, p-ethylphenol, propylphenol, n-butylphenol, t-butylphenol, 1-naphthol and 2-naphthol, and other polynuclear aromatic hydrocarbons having two or more hydroxyl groups, to at least one aldehyde or ketone selected from aldehydes such as formaldehyde, acetaldehyde, propionaldehyde, benzaldehyde and furfural, and ketones such as acetone, methyl ethyl ketone and methyl isobutyl ketone, in the presence of an alkaline catalyst.

The formaldehyde and acetaldehyde may be replaced by paraformaldehyde and para-aldehyde, respectively. The weight average molecular weight of the resol resin is preferably from 500 to 10,000, more preferably from 1,000 to 5,000.

Preferred examples of the polyvinyl phenol resin include homopolymers of a hydroxystyrene such as o-hydroxystyrene, m-hydroxystyrene, p-hydroxystyrene, 2-(o-hydroxyphenyl)propylene, 2-(m-hydroxyphenyl)propylene and 2-(p-hydroxyphenyl)propylene, and copolymers of two or more thereof. These hydroxystyrenes may have a substituent on the aromatic ring, such as a halogen (e.g., chlorine, bromine, iodine, fluorine) or an alkyl group having from 1 to 4 carbon atoms. Accordingly, the polyvinyl phenols include a polyvinyl phenol which may have a halogen or an alkyl group having from 1 to 4 carbon atoms on the aromatic ring.

In addition, copolymers of a hydroxystyrene such as o-hydroxystyrene, m-hydroxystyrene, p-hydroxystyrene, 2-(o-hydroxyphenyl)propylene, 2-(m-hydroxyphenyl)propylene and 2-(p-hydroxyphenyl)propylene, with a methacrylic acid, an acrylic acid, an alkyl methacrylate or an alkyl acrylate are also useful.

The polyvinyl phenol resin is usually obtained by polymerizing hydroxystyrenes which may have a substituent, individually or in combination of two or more thereof in the presence of a radical polymerization initiator or a cationic polymerization initiator. This polyvinyl phenol resin may be partially hydrogenated or may be a resin where a part of hydroxyl groups are protected by a tert-butoxy carbonyl group, a pyranyl group or a furanyl group. The weight average molecular weight of the polyvinyl phenol resin is preferably from 1,000 to 100,000, more preferably from 1,500 to 50,000.

As the ketone pyrogallol resin, acetone pyrogallol resin is particularly useful.

The mixing ratio of the resin having this aromatic hydroxyl group is 20% by weight or less, preferably 12% by weight or less, based on the solid content of the water-receptive layer.

In addition to the colloidal oxide or hydroxide of the above-described element and the resin having an aromatic hydroxyl group, the water-receptive layer of the present invention may contain a crosslinking agent which accelerates the crosslinking of colloidal oxide or hydroxide. Preferred examples of this crosslinking agent include an initial hydrolysis condensate of tetraalkoxysilane, a trialkoxysilylpropyl-N,N,N-trialkylammonium halide and an aminopropyltrialkoxysilane. The ratio added thereof is preferably 5% by weight or less based on the solid content of the water-receptive layer.

Furthermore, the water-receptive layer for use in the present invention may contain a crosslinking agent for the above-described hydrophilic resin or resin having an aromatic hydroxyl group in order to enhance the impression capacity at the time of printing. Examples of this crosslinking agent include formaldehyde, glyoxal, polyisocyanate, initial hydrolysis-condensate of tetraalkoxysilane, dimethylolurea and hexamethylolmelamine.

Still further, the water-receptive layer for use in the present invention may contain a well-known fluorine-containing surfactant, silicon-containing surfactant or polyoxyethylene-containing surfactant for the purpose of improving the surface state in the coating.

In the present invention, the thickness of the water-receptive layer coated is preferably from 0.1 to 3 μm, more preferably from 0.5 to 2 μm. Within this range, the durability of the water-receptive layer can be ensured and a good press life at the printing can be obtained.

In the case of using a general semiconductor laser available on the market, the image drawing requires an energy of 250 to 400 $mJ/cm^2$ for the thickness of about 0.5 μm and an energy of 350 to 500 $mJ/cm^2$ for the thickness of about 1.5 μm. Accordingly, if the thickness is too large, a large amount of energy is necessary for peeling off the water-receptive layer by ablation from the ink-receptive layer, the exposure by a laser takes a long time, and the productivity in the production of printing plates decreases.

The heat-sensitive lithographic printing plate precursor of the present invention can have a water-soluble overcoat layer on the water-receptive layer. By virtue of this overcoat layer, the water-receptive layer can be protected from staining or scratching due to an ink-receptive substance during storage or handling of the printing plate. Furthermore, by incorporating a compound capable of converting light into heat into the overcoat layer, the compound capable of converting light into heat needs not be added to the water-receptive layer in a large amount, as a result, high sensitivity can be attained without deteriorating the hydrophilicity or film quality of the water-receptive layer.

The water-soluble overcoat layer which can be used in the present invention, can be easily removed at the time of printing and contains a resin selected from water-soluble polymer compounds. The water-soluble polymer compound used here provides, after coating and drying, a coating having a film-forming capability and specific examples thereof include a polyvinyl acetate (however, having a hydrolysis ratio of 65% or more), a polyacrylic acid and an alkali metal salt or amine salt thereof, an acrylic acid copolymer and an alkali metal salt or amine salt thereof, a polymethacrylic acid and an alkali metal salt or amine salt thereof, a methacrylic acid copolymer and an alkali metal salt or amine salt thereof, a homopolymer and a copolymer of acrylamide, a polyhydroxyethyl acrylate, a homopolymer and a copolymer of vinyl pyrrolidone, a polyvinyl methyl ether, a vinyl methyl ether/maleic anhydride copolymer, a poly-2-acrylamido-2-methyl-1-propanesulfonic acid and an alkali metal salt or amine salt thereof, a 2-acrylamide-2-methyl-1-propanesulfonic acid copolymer and an alkali metal salt or amine salt thereof, gum arabic, a cellulose derivative (e.g., carboxymethyl cellulose, carboxyethyl cellulose, methyl cellulose) and a denatured product thereof, a white dextrin, a pullulan, and an enzyme-decomposed etherified dextrin. These resins may be used in combination of two or more thereof according to the use end.

In the case where the overcoat layer is coated in the form of an aqueous solution, mainly a nonionic surfactant may be added for the purpose of ensuring the uniformity of coating. Specific examples of the nonionic surfactant include sorbitan tristearate, sorbitan monopalmitate, sorbitan trioleate, stearic acid monoglyceride, polyoxyethylene nonylphenyl ether and polyoxyethylene dodecyl ether.

The ratio of the nonionic surfactant occupying in the solid contents of the overcoat layer is preferably from 0.05 to 5% by weight, more preferably from 1 to 3% by weight.

In the present invention, the thickness of the overcoat layer is preferably from 0.05 to 4.0 $\mu$m, more preferably from 0.1 to 1.0 $\mu$m. Within this range, staining by an ink-receptive substance or scratching can be satisfactorily prevented. If the thickness is too large, this causes adverse effects, for example, the removal of the overcoat layer takes a long time at the printing, the water-soluble resin dissolved out in a large amount affects the fountain solution, roller stripping is generated at the printing, or the ink fails in inking on the image area.

In the present invention, at least one of the ink-receptive layer, the water-receptive layer and the overcoat layer contains a compound capable of converting light into heat which absorbs an infrared ray and generates heat.

The compound capable of converting light into heat may be sufficient if it is a light absorbing substance having an absorption band at least in a part of 700 to 1,200 nm.

The pigment which can be used include commercially available pigments and infrared absorbing pigments described in *Color Index* (*C. I.*) *Binran "Saishin Ganryo Binran"* (*Color Index* (*C. I.*) *Handbook "Handbook of Newest Dyes"*), compiled by Nippon Ganryo Gijutsu Kyokai (1977), *Saishin Ganryo Oyo Gijutsu* (*Newest Pigment Application Technology*), CMC Shuppan (1986), and *Insatsu Ink Gijutsu* (*Printing Ink Technology*), CMC Shuppan (1984).

If desired, the pigment may be subjected to a known surface treatment before use so as to improve the dispersibility in the layer to which the pigment is added. Examples of the method for performing the surface treatment include a method of surface-coating a hydrophilic resin or a lipophilic resin, a method of adhering a surfactant, and a method of bonding a reactive substance (for example, a silica sol, alumina sol or silane coupling agent, an epoxy compound or an isocyanate compound) to the pigment surface.

The pigment added to the overcoat layer or water-receptive layer is preferably surface-coated with a hydrophilic resin or a silica sol so as to facilitate the dispersion with a water-soluble resin and not to impair the hydrophilicity. The particle size of the pigment is preferably from 0.01 to 1 $\mu$m, more preferably from 0.01 to 0.5 $\mu$m. For dispersing the pigment, a well-known dispersion technique for use in the production of ink or toner can be used.

Among the pigments, carbon black is a particularly preferred.

Examples of the dye include commercially available dyes and well-known dyes described in publications (for example, *Senryo Binran* (*Dye Handbook*), compiled by Yuki Gosei Kagaku Kyokai (1960), *Kagaku Kogyo, "Kin-Sekigai Kyusho Shikiso"* (*Chemical Engineering, "Near Infrared Absorbing Dyes"*), pp. 45–51 (May, 1986), and 90-*Nen Dai Kinosei Shikiso no Kaihatsu to Shijo Doko* (*Development and Movement on Market of Functional Dyes in* 90*s*), Chap. 2, Item 2.3, CMC (1990)) and patents. More specifically, infrared absorbing dyes such as azo dye, metal complex salt azo dye, pyrazolone azo dye, anthraquinone dye, phthalocyanine dye, carbonium dye, quinoneimine dye, polymethine dye and cyanine dye are preferred.

Other examples of the dye include cyanine dyes described in JP-A-58-125246, JP-A-59-84356 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, cyanine dyes described in British Patent 434,875, dyes described in U.S. Pat. No. 4,756,993, cyanine dyes described in U.S. Pat. No. 4,973,572, and dyes described in JP-A-10-268512.

Also, near infrared absorbing sensitizers described in U.S. Pat. No. 5,156,938 can be suitably used as the dye. In addition, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-based compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, pyrylium compounds disclosed in JP-B-5-13514 and JP-B-5-19702, and Epolite III-178, Epolite III-130 and Epolite III-125 produced by Epoline are preferably used.

Among these, water-soluble dyes are preferred as the dye added to the overcoat layer or water-receptive layer. Specific examples thereof are exemplified below by their structural formulae.

(IR-1)
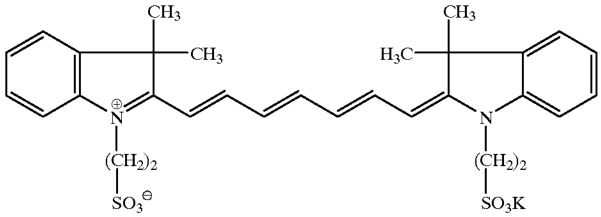
(IR-2)
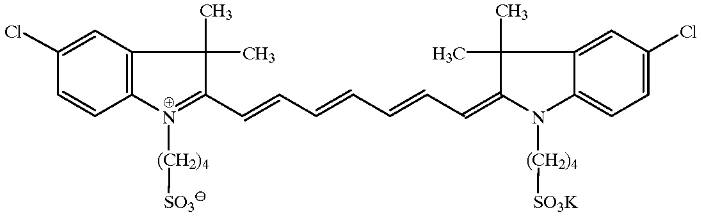
(IR-3)
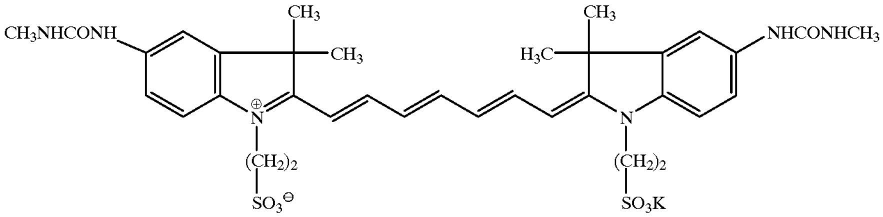
(IR-4)
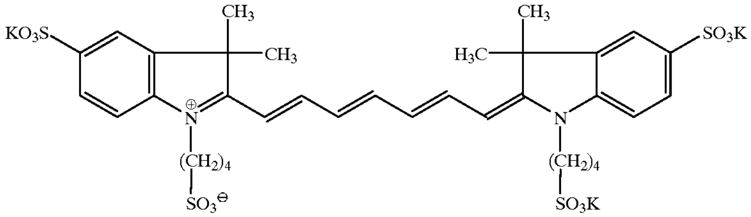
(IR-5)
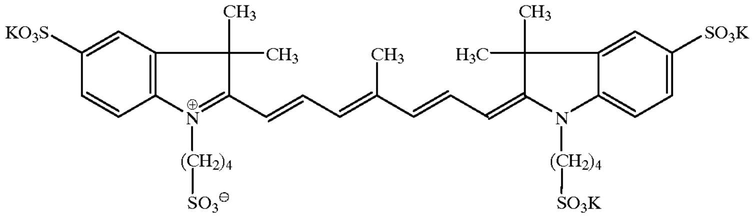
(IR-6)
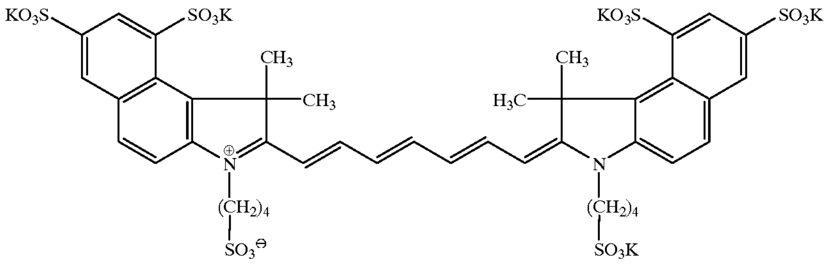

-continued
(IR-7)
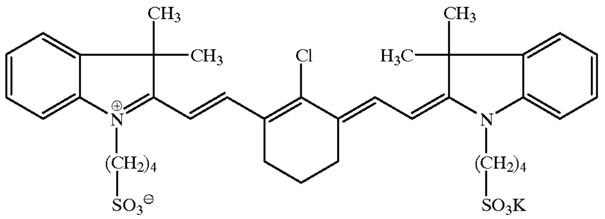
(IR-8)
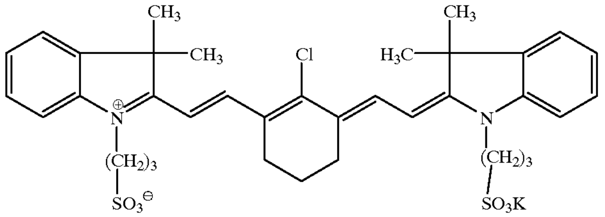
(IR-9)
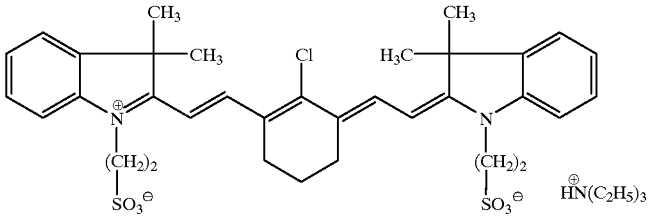
(IR-10)
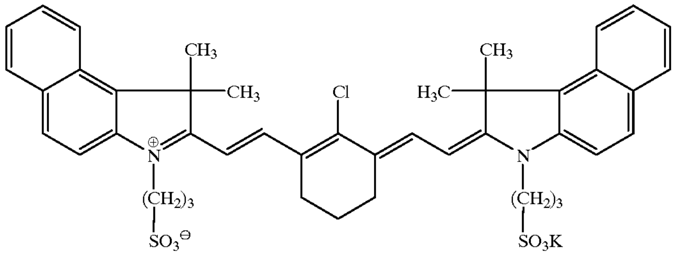
(IR-11)
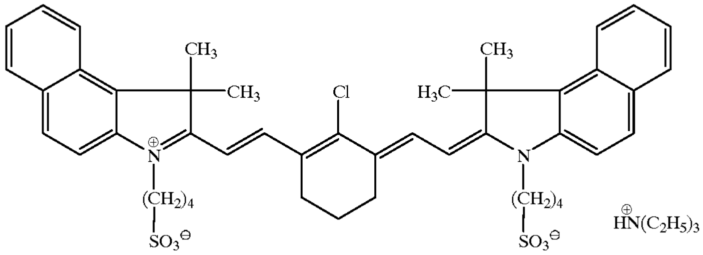

In the present invention, the compound capable of converting light into heat for use in the ink-receptive layer may be the above-described infrared absorbing dye but is more preferably an ink-receptive dye. Specific examples thereof include the following cyanine dyes.

In the case of adding the compound capable of converting light into heat to the overcoat layer, the ratio added thereof is from 1 to 70% by weight, preferably from 2 to 50% by weight, and more preferably from 2 to 30% by weight when the compound capable of converting light into heat is a dye, (IR-21)

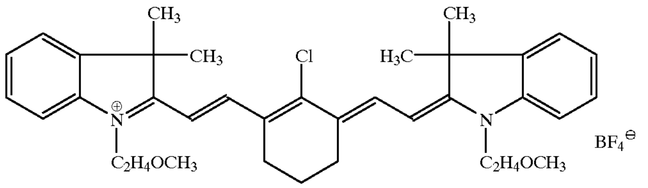

(IR-22)

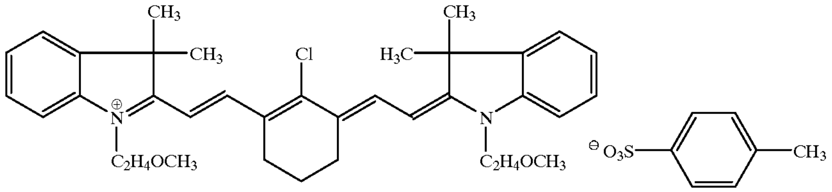

(IR-23)

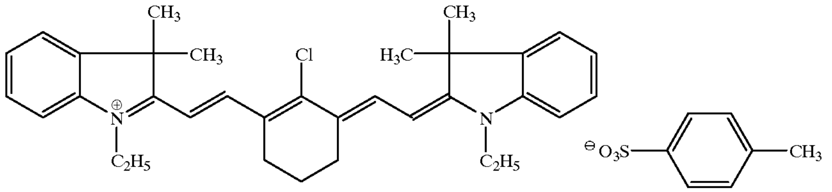

(IR-24)

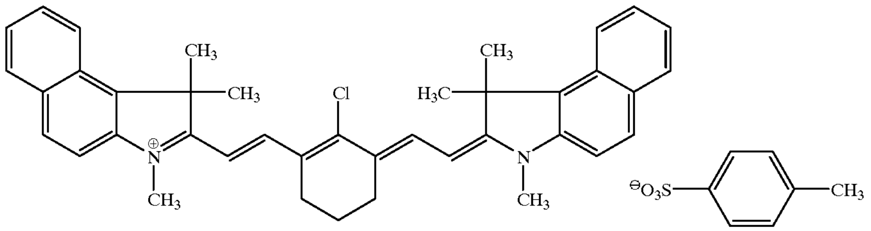

(IR-25)

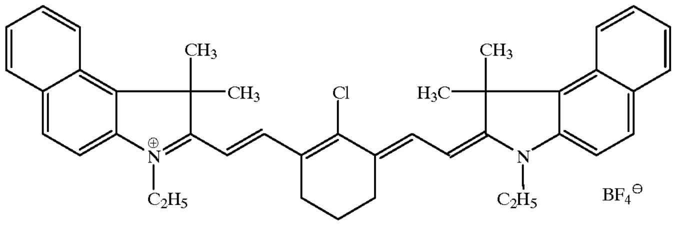

The ratio of the compound capable of converting light into heat added is, in the case of adding it to the binder polymer of the water-receptive layer, suitably from 1 to 70% by weight, more preferably from 2 to 50% by weight, based on the solid contents in the water-receptive layer. Within this range, good sensitivity can be obtained while not impairing the hydrophilicity of the water-receptive layer.

In the case of adding the compound capable of converting light into heat to the ink-receptive layer, the ratio added thereof is from 1 to 40% by weight, preferably from 2 to 20% by weight, based on the solid contents of the ink-receptive layer. Within this range, good sensitivity can be obtained while not impairing the film quality.

or from 20 to 50% by weight when the compound capable of converting light into heat is pigment, based on the solid content of the overcoat layer. Within this range, good sensitivity can be obtained while not impairing the uniformity of the overcoat layer or the strength of the film.

Also, in the case of adding the compound capable of converting light into heat to the overcoat layer, according to the amount added thereof, the amount of the compound capable of converting light into heat added to the water-receptive layer and the ink-receptive layer may be reduced or may be nil.

On the heat-sensitive lithographic printing plate precursor of the present invention, an image is formed by heat. More specifically, direct image recording by a thermal recording head or the like, scanning exposure by an infrared ray laser, high-intensity flash exposure by a xenon discharge lamp, or infrared ray lamp exposure may be applied. In particular, the exposure is suitably performed using a semiconductor laser which radiates an infrared ray in the wavelength range of 700 to 1,200 nm, or a solid high output infrared ray laser such as YAG laser.

The image-exposed printing plate precursor of the present invention may be mounted on a printing press without passing through any more processing. When the printing is started using ink and fountain solution, the water-receptive layer is removed, ink is adhered to the exposed ink-receptive layer portion, and thereby the printing proceeds. The overcoat layer is swiftly dissolved and removed upon contact with the fountain solution and scarcely affects the printing.

The lithographic printing plate precursor of the present invention can also be used for the on-press development where the printing plate precursor is fixed onto a printing press cylinder and exposed by a laser mounted on the printing press and then fountain solution and/or ink may be applied thereto.

EXAMPLES

The present invention is described in greater detail below by referring to the Examples, however, the present invention should not be construed as being limited thereto.

Examples 1 to 3 and Comparative Examples 1 to 3

On an aluminum support (constructive material: JIS A1050, thickness: 0.24 mm, grained roughness Ra [center line average surface roughness: JIS B0601]: 0.45 μm, weight of anodic oxide film: 2.7 g/$m^2$) subjected to graining, anodization and treatment with sodium silicate solution by a well-known method, Coating Solution A-1 for the ink-receptive layer shown below was coated by means of a bar in a coating solution amount of 12 ml/$m^2$. Thereafter, the support was dried at 100° C. for 1 minute to provide an ink-receptive layer having a dry coated amount of 0.5 g/$m^2$.

| (Coating Solution A-1 for Ink-Receptive Layer) | |
|---|---|
| Epoxy resin (see, Table 1) | 3 g |
| Megafac F-177 (a fluorine-containing surfactant, produced by Dai-Nippon Ink & Chemicals, Inc.) | 0.04 g |
| Methyl ethyl ketone | 37 g |
| Polypropylene glycol monomethyl ether | 20 g |

On the thus-provided ink-receptive layer, Coating Solution B-1 for the water-receptive layer shown below was coated and dried at 40° C. for 3 minutes to obtain a heat-sensitive lithographic printing plate precursor in which the dry coated amount of the water-receptive layer was 1 g/$m^2$.

| (Coating Solution B-1 for Water-Receptive Layer) | |
|---|---|
| 10 wt % Methanol solution of poly-2-hydroxyethyl methacrylate (weight average molecular weight: 300,000) | 1 g |
| Methanol silica (produced by Nissan Chemical, a colloid comprising a methanol solution containing 30 wt % of silica particles having a particle size of 10 to 20 nm) | 3 g |
| Compound capable of converting light into heat (Dye IR-11 described in the present invention) | 0.09 g |
| Methyl lactate | 0.5 g |
| Methanol | 15.5 g |

-continued

The thus-prepared lithographic printing plate precursor was exposed at 300 mJ/$m^2$ using Trendsetter (a plate setter having mounted thereon a semiconductor laser of 40 W at 830 nm) manufactured by Creo. The exposed printing plate precursor as it is but not processed any more was fixed to a printing press ("Lithrone" manufactured by Komori Corporation) and the printing was performed using a fountain solution comprising plate etching solution (EU-3, produced by Fuji Photo Film Co., Ltd.)/water/isopropyl alcohol (volume ratio: 1/99/10), and Japanese ink (GEOS-G, produced by Dai-Nippon Ink & Chemicals, Inc.).

TABLE 1

| | Resin of Ink-Receptive Layer | | Printing Results | |
|---|---|---|---|---|
| | Name of Resin | Softening Point (° C.) | Impression Capacity (sheets) | Printing Stain |
| Example 1 | EPIKOTE 1007 | 128 | 20,000 | good |
| Example 2 | EPIKOTE 1009 | 144 | 20,000 | good |
| Example 3 | EPIKOTE 1010 | 169 | 20,000 | good |
| Comparative Example 1 | EPIKOTE 1001 | 58 | (image formation failure) | |
| Comparative Example 2 | EPIKOTE 1002 | 78 | (image formation failure) | |
| Comparative Example 3 | polyvinyl formal | — | 10,000 | good |

In Table 1, EPIKOTE is an epoxy resin produced by Yuka Shell Epoxy Co., Ltd. In Comparative Example 3, a polyvinyl formal resin (Denka Formal #200, produced by Denki Kagaku Kogyo K. K.) was used in place of the epoxy resin.

It is seen from these results that by the epoxy resin having a high softening point, high impression capacity can be attained.

Example 4

A heat-sensitive lithographic printing plate precursor in which the dry coated amount of the water-receptive layer was 1 g/$m^2$, was obtained by applying Coating Solution B-2 for the water-receptive layer shown below on the same ink-receptive layer as in Example 2 and drying it at 40° C. for 3 minutes.

| (Coating Solution B-2 for Water-Receptive Layer) | |
|---|---|
| Novolak Resin (N1) | 0.05 g |
| Glassca 401 (i.e., Ceramica G-401) | 4.5 g |
| Methyl lactate | 0.5 g |
| Methanol | 15.5 g |

Novolak Resin (N1) is an addition condensate of a 6/4 (by weight) mixture of m-cresol and p-cresol with paraformaldehyde and has a weight average molecular weight of 3,500.

Glassca 401 is a 20 wt % methanol colloid solution comprising $ZrO_2.SiO_2$ produced by Nichiban Kenkyusho.

The thus-obtained heat-sensitive lithographic printing plate precursor was subjected to exposure and printing in the same manner as in Example 1, as a result, 20,000 sheets of good printed matter free of any staining were obtained.

Example 5

On the surface-treated aluminum support used in Example 1, Coating Solution A-2 for the ink-receptive layer shown below was coated by means of a bar in a coating solution amount of 12 ml/$m^2$ and then dried by heating at 100° C. for 1 minute to provide an ink-receptive layer having a dry coated amount of 0.5 g/$m^2$.

| (Coating Solution A-2 for Ink-Receptive Layer) | |
|---|---|
| Epoxy resin (EPIKOTE 1100L, softening point: 149° C.) | 3 g |
| Megafac F-177 | 0.04 g |
| Methyl ethyl ketone | 37 g |
| Polypropylene glycol monomethyl ether | 20 g |

On this ink-receptive layer, Coating Solution B-3 for the water-receptive layer shown below was coated and dried at 100° C. for 1 minute to provide a water-receptive layer having a dry coated amount of 1 g/$m^2$.

| (Coating Solution B-3 for Water-Receptive Layer) | |
|---|---|
| Poly-2-hydroxyethyl methacrylate (the same as in Example 1) | 1 g |
| Methanol silica (the same as in Example 1) | 3 g |
| Methyl lactate | 0.5 g |
| Methanol | 15.5 g |

On this water-receptive layer, Coating Solution OC-1 for the overcoat layer shown below was coated and dried at 100° C. for 90 seconds to manufacture a heat-sensitive lithographic printing plate precursor having an overcoat layer of which dry coated weight was 0.5 g/$m^2$.

| (Coating Solution OC-1 for Overcoat Layer) | |
|---|---|
| Polyacrylic acid (weight average molecular weight: 50,000) | 1.0 g |
| Compound capable of converting light into heat (Dye IR-11 described in the present invention) | 0.2 g |
| Polyoxyethylene nonylphenyl ether | 0.04 g |
| Water | 19 g |

The thus-obtained heat-sensitive lithographic printing plate precursor was exposed at 350 mJ/$m^2$ using the same plate setter as in Example 1 and subjected to printing in the same printing press as in Example 1, as a results, 20,000 sheets of good printed matters free of any staining were obtained.

Example 6

On the surface-treated aluminum support used in Example 1, Coating Solution A-3 for the ink-receptive layer shown below was coated by means of a bar in a coating solution amount of 12 ml/$m^2$ and then dried by heating at 100° C. for 1 minute to provide an ink-receptive layer having a dry coated amount of 0.5 g/$m^2$.

| (Coating Solution A-3 for Ink-Receptive Layer) | |
|---|---|
| Epoxy resin (EPIKOTE 1009) | 3 g |
| Compound capable of converting light into heat (Dye IR-24 described in the present invention) | 0.3 g |
| Megafac F-177 | 0.04 g |
| Methyl ethyl ketone | 37 g |
| Polypropylene glycol monomethyl ether | 20 g |

On this ink-receptive layer, the same water-receptive layer as in Example 1 was provided and further thereon, the same overcoat layer as in Example 5 was coated to obtain a heat-sensitive lithographic printing plate precursor.

This lithographic printing plate precursor was subjected to exposure and printing in the same manner as in Example 1, as a results, 20,000 sheets of good printed matters free of staining were obtained.

According to the present invention, a heat-sensitive lithographic printing plate precursor comprising a metal support is obtained, which can be mounted directly on a printing press without passing through any processing after exposure and can be used for printing and which is improved in the impression capacity.

While the invention has been described in detail and with reference to specific embodiments thereof, it will be apparent to one skilled in the art that various changes and modifications can be made therein without departing from the spirit and scope thereof.

What is claimed is:

1. A heat-sensitive lithographic printing plate precursor comprising a metal substrate having thereon 1) an ink-receptive layer and 2) a water-receptive layer comprising a colloidal particulate oxide or hydroxide of at least one element selected from the group consisting of beryllium, magnesium, aluminum, silicon, titanium, boron, germanium, tin, zirconium, iron, vanadium, antimony and transition metals, at least one layer of the ink-receptive layer and the water-receptive layer containing a compound capable of converting light into heat and the ink-receptive layer containing an epoxy resin having a softening point of 120° C. or more.

2. The heat-sensitive lithographic printing plate precursor comprising a metal substrate having thereon 1) an ink-receptive layer and 2) the water-receptive layer as in claim 1, wherein the metal substrate is an aluminum substrate having a thickness of from 0.05 to 0.6 mm.

3. The heat-sensitive lithographic printing plate precursor comprising a metal substrate having thereon 1) an ink-receptive layer and 2) the water-receptive layer as in claim 1, wherein the ink-receptive layer has a thickness of 0.1 μm or more.

4. The heat-sensitive lithographic printing plate precursor comprising a metal substrate having thereon 1) an ink-receptive layer and 2) the water-receptive layer as in claim 1, wherein the water-receptive layer has a thickness of 0.1 μm to 3 μm.

5. The heat-sensitive lithographic printing plate precursor comprising a metal substrate having thereon 1) an ink-receptive layer, 2) a water-receptive layer comprising a colloidal particulate oxide or hydroxide of at least one element selected from the group consisting of beryllium, magnesium, aluminum, silicon, titanium, boron, germanium, tin, zirconium, iron, vanadium, antimony and transition metal, and 3) a water-soluble overcoat layer; at least one layer of the ink-receptive layer, the water-receptive layer and the water-soluble overcoat layer containing a compound capable of converting light into heat; and the ink-receptive layer containing an epoxy resin having a softening point of 120° C. or more.

6. The heat-sensitive lithographic printing plate precursor comprising a metal substrate having thereon 1) an ink-receptive layer and 2) the water-receptive layer as in claim 5, wherein the water soluble overcoat layer has a thickness of 0.05 μm to 4.0 μm.

7. The heat-sensitive lithographic printing plate precursor comprising a metal substrate having thereon 1) an ink-receptive layer and 2) the water-receptive layer as in claim 5, wherein when the compound capable of converting light into heat is added to the water-receptive layer, the addition ratio is from 1 to 70% by weight based on the solid contents of the water-receptive layer; when the compound capable of converting light into heat is added to the ink-receptive layer, the addition ratio is from 1 to 40% by weight based on the solid contents of the ink-receptive layer; and when the compound capable converting light into heat is added to the overcoat layer, the addition ratio is from 2 to 50% by weight based on the solid contents of the overcoat layer.

* * * * *